United States Patent [19]
Lee

[11] Patent Number: 5,326,713
[45] Date of Patent: Jul. 5, 1994

[54] BURIED CONTACT PROCESS

[75] Inventor: Jin-Yuan Lee, Hsin-Chu, Taiwan

[73] Assignee: Taiwan Semiconductor manufactures Company, Hsinchu, Taiwan

[21] Appl. No.: 941,229

[22] Filed: Sep. 4, 1992

[51] Int. Cl.⁵ .......................................... H01L 21/283
[52] U.S. Cl. ...................................... 437/41; 437/186; 437/191
[58] Field of Search .......................... 437/41, 186, 191

[56] References Cited

U.S. PATENT DOCUMENTS

| | | | |
|---|---|---|---|
| 3,750,268 | 8/1973 | Wang | 437/186 |
| 5,030,584 | 7/1991 | Nakata | 437/44 |
| 5,049,514 | 9/1991 | Mori | 437/41 |
| 5,214,295 | 5/1993 | Manning | 437/186 |

FOREIGN PATENT DOCUMENTS

| | | | |
|---|---|---|---|
| 53-147473 | 12/1978 | Japan | 437/186 |
| 54-57881 | 5/1979 | Japan | 437/186 |
| 59-2191 | 1/1984 | Japan | 437/186 |
| 60-170974 | 9/1985 | Japan | 437/41 |

Primary Examiner—R. Bruce Breneman
Assistant Examiner—Ourmazd S. Ojan
Attorney, Agent, or Firm—George O. Saile

[57] ABSTRACT

A method of forming a buried contact to a source/drain junction or other active device region in a silicon substrate. A silicon oxide layer is formed over the silicon substrate. A first polysilicon layer is formed over the silicon oxide layer. A resist mask having an opening over the planned said buried contact is formed and the first polysilicon layer is isotropically etched to form a tapered opening to said underlying silicon oxide which opening undercuts the resist mask. The silicon oxide layer is anisotropically etched using the same resist mask which results in an opening to the silicon substrate corresponding to the resist pattern opening while leaving a silicon oxide border uncovered with the first polysilicon layer. A second polysilicon layer is deposited over the first polysilicon layer, the opening to the silicon substrate and the border of uncovered silicon oxide. The planned buried contact region is covered with a resist mask. Openings are formed to the planned source and drain regions wherein at least one of the source and drain regions is adjacent to the opening of the planned buried contact. The resist mask is removed. Ions are implanted through the second polysilicon layer in the opening to the silicon substrate to form the source and drain regions. The structure is heated to cause the formation of the buried region under the buried contact by outdiffusion from the buried contact layer.

14 Claims, 3 Drawing Sheets

BURIED CONTACT PROCESS

BACKGROUND OF THE INVENTION

1. Field of the Invention

The invention relates to the fabrication of integrated circuit devices, and more particularly, to a method of forming source/drain buried contact junctions in the fabrication of integrated circuits.

2. Description of the Prior Art

In forming buried contact regions, a wider and deeper junction is allowable for a contact, but is not acceptable for a high quality source/drain region in integrated circuits designed in the less than one micron era.

A typical buried contact process flow is to deposit a doped layer of polysilicon over and on the planned source/drain regions. The structure is heated and the source/drain regions are formed by outdiffusion from the doped polysilicon layer. The doped polysilicon layer is allowed to remain on the source/drain regions as their contacts. This is called the buried contact process.

A number of workers have addressed this and other problems involving forming source/drain regions. U.S. Pat. No. 5,049,514 to Mori shows a process of doping polysilicon, open metal silicide layer, ion implanting, and annealing to form the source/drain region. U.S. Pat. No. 5,030,584 to H. Nakata describes a process involving outdiffusion to form source/drain regions and to leave the contact and source of dopants for the source/drain regions in place. While this patent's invention has the advantage of self alignment of the contact to the source/drain, it does not have the desired tailoring of the source/drain regions to the optimum conditions for the under one micron era.

SUMMARY OF THE INVENTION

A principal object of the present invention is to provide an effective and very manufacturable method of forming source/drain buried contact junctions.

Another object of the present invention is to provide a method of forming source/drain buried contact junctions that are very shallow and provide lower sheet resistance than any prior art process.

In accordance with the objects of this invention a new method of forming source/drain buried contact junctions is achieved. The method of forming a buried contact to a source/drain junction or other active device region in a silicon substrate is described. A silicon oxide layer is formed over the silicon substrate. A first polysilicon layer is formed over the silicon oxide layer. A resist mask having an opening over the planned said buried contact is formed and the first polysilicon layer is isotropically etched to form a tapered opening to said underlying silicon oxide which opening undercuts the resist mask. The silicon oxide layer is anisotropically etched using the same resist mask which results in an opening to the silicon substrate corresponding to the resist pattern opening while leaving a silicon oxide border uncovered with the first polysilicon layer. A second polysilicon layer is deposited over the first polysilicon layer, the opening to the silicon substrate and the border of uncovered silicon oxide. The planned buried contact region is covered with a resist mask. Openings are formed to the planned source and drain regions wherein at least one of the source and drain regions is adjacent to the opening of the planned buried contact. The resist mask is removed. Ions are implanted through the second polysilicon layer in the opening to the silicon substrate to form the source and drain regions. The structure is heated to cause the formation of the buried region under the buried contact by outdiffusion from the buried contact layer and to make electrical contact to at least one of the adjacent source and drain regions.

BRIEF DESCRIPTION OF THE DRAWINGS

In the accompanying drawings forming a material part of this description, there is shown.

DESCRIPTION OF THE PREFERRED EMBODIMENTS

Figure 1:
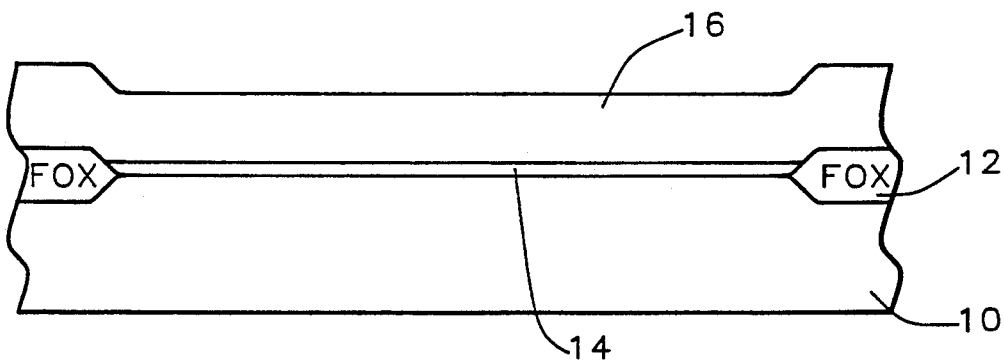
FIGS. 1 through 6 schematically illustrate in cross-sectional representation one preferred embodiment of this invention.

Referring now more particularly to FIGS. 1 through 6, there is shown a first embodiment method for forming the improved buried contact of the invention. FIG. 1 is an illustration of an N channel device portion of a partially completed integrated circuit in which there is a monocrystalline semiconductor substrate 10 in which there are formed field oxide regions 12. This N channel portion may be part of a CMOS metal oxide field effect transistor (MOSFET). The semiconductor substrate 10 is preferably composed of silicon having a (100) crystallographic orientation.

In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field Oxide pattern, FOX 12. Then semiconductor devices can be provided in the silicon mesas according to the following processes.

The surface of the silicon substrate 10 is thermally oxidized to form the desired gate oxide 14 thickness. The preferred thickness is between about 70 to 200 Angstroms.

The polysilicon layer 16 is blanket deposited and doped with phosphorus oxychloride at a temperature of between about 800° to 1000° C. However, the layer 16 may alternatively be deposited as in situ doped as is understood in the art. The layer will be doped with N+ impurities, such as phosphorus or arsenic where an N channel MOSFET is being formed and with P+ impurities, such as boron where a P channel MOSFET is being formed.

Figure 2:
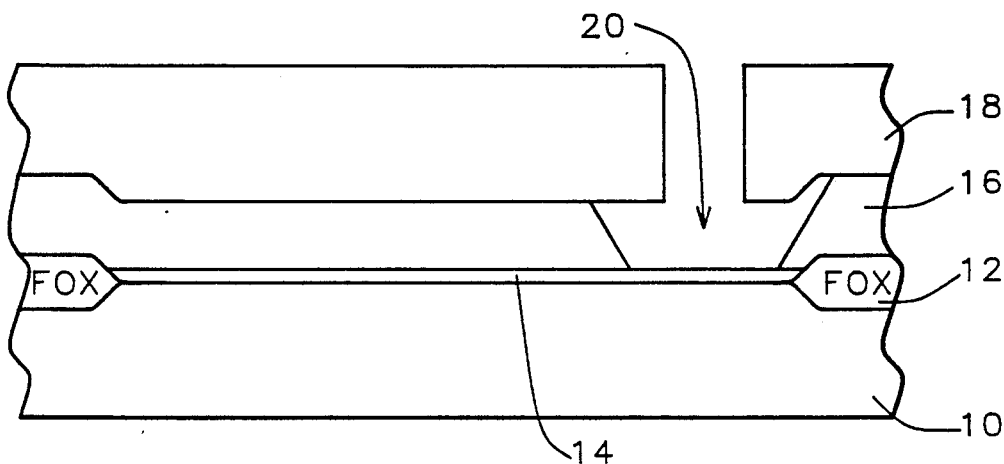
Figure 3:
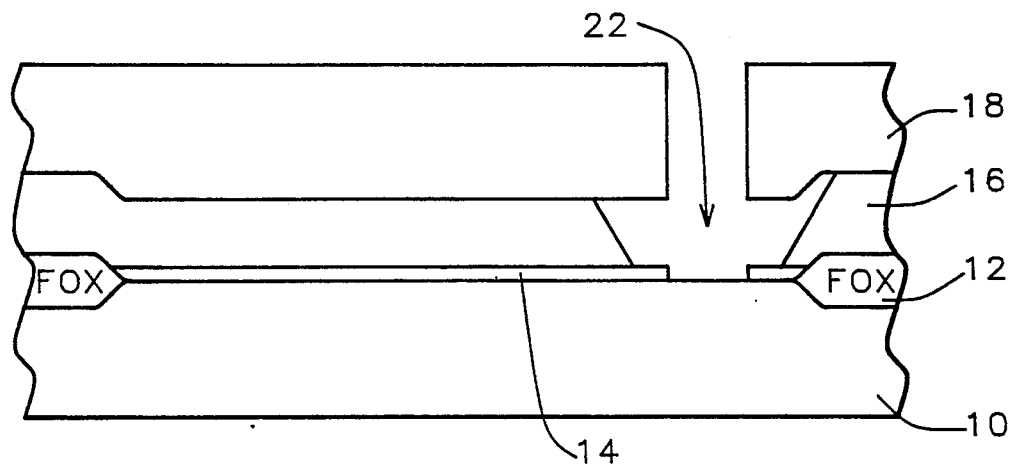
Figure 4:
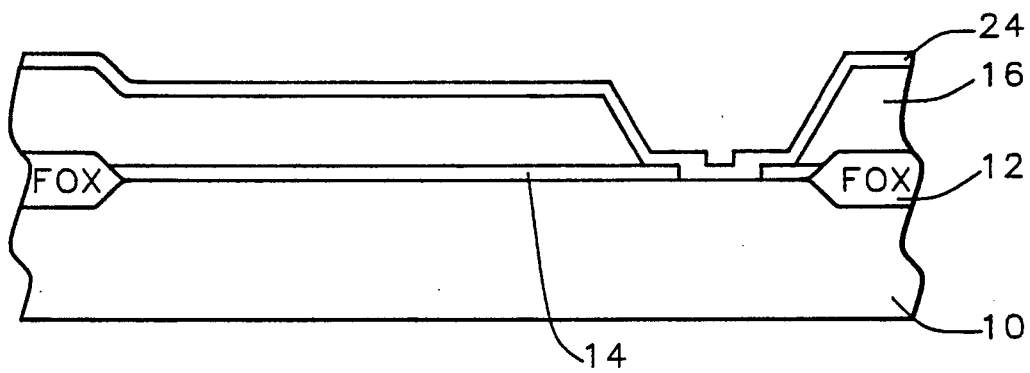

Referring now to FIG. 2, a photoresist layer covers the polysilicon layer 16. The photoresist is exposed to actinic light through openings in a mask and developed to produce the desired buried contact pattern in the surfaces of the photoresist. The resulting resist mask layer 18 has openings at the planned locations of the buried contacts to the source/drain regions. The underlying doped polysilicon layer 16 is isotropically etched according to the pattern opening. $SF_6/He$ is the etchant ambient used under reactive ion etching mode at 25° C.

to stop at the gate oxide and overetch 1500 to 4500 Angstroms. This etching results in opening 20 to the gate oxide layer 14. The opening in the polysilicon 18 is wide and undercuts the photoresist. The undercut should be at least 2000 Angstroms.

The gate oxide 14 layer is now etched anisotropically according to the same mask opening as used for the polysilicon etch. Reactive ion etching with $CF_4/CHF_3$ gas is used. This results in a narrow opening 22, shown in FIG. 3, through the gate oxide layer to the underlying substrate 10. The opening corresponds to the photomask pattern.

The important and critical result of these two etching steps is to remove the polysilicon layer 16 between about 1000 to 3000 Angstroms from the edge of the opening through the gate silicon oxide layer 14 to the silicon substrate where the planned source/drain buried contact region is to be formed. That is, there has been formed a border of silicon oxide uncovered with the first polysilicon layer 16.

Figure 5:
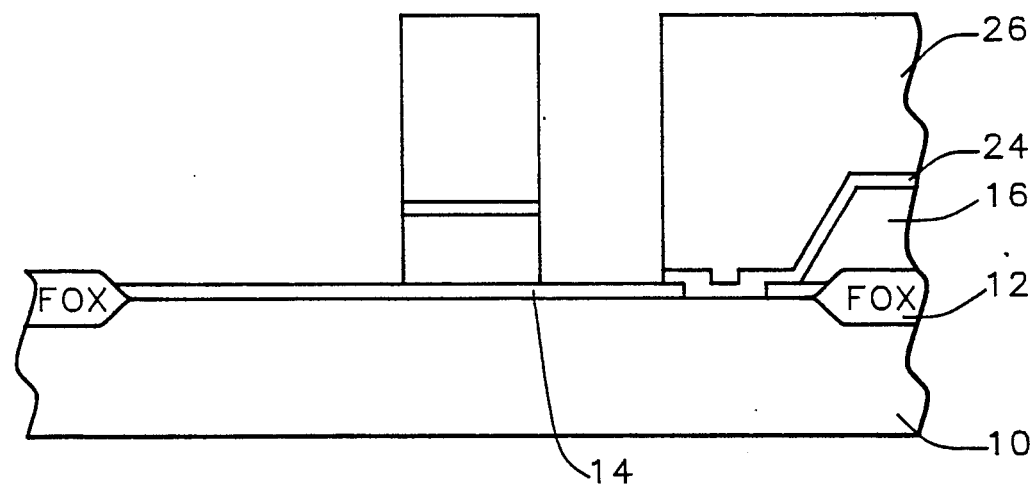

The remaining resist mask is stripped and a second thin undoped polysilicon layer 24 is deposited over the wafer to a thickness of between about 400 to 1000 Angstroms. This is shown as 24 in FIG. 9. The polysilicon layer is formed using the same conditions as described above with respect to the first polysilicon layer 16. A second resist layer is deposited over the polysilicon layer 24, exposed to light through a mask and developed to form resist mask 26 as seen in FIG. 5. The resist mask protects the planned gate electrode region and the buried contact region that has been already formed as seen in the FIG. 5. The two layers of polysilicon, 16 and 24, are anisotropically etched to produce the desired gate pattern and down to the silicon substrate in the areas planned for source/drain ion implantation. Reactive ion etching with $CF_4/CHF_3$ gas is used.

The resist mask 26 is now removed by conventional techniques such as ashing or other stripping methods.

Figure 6:
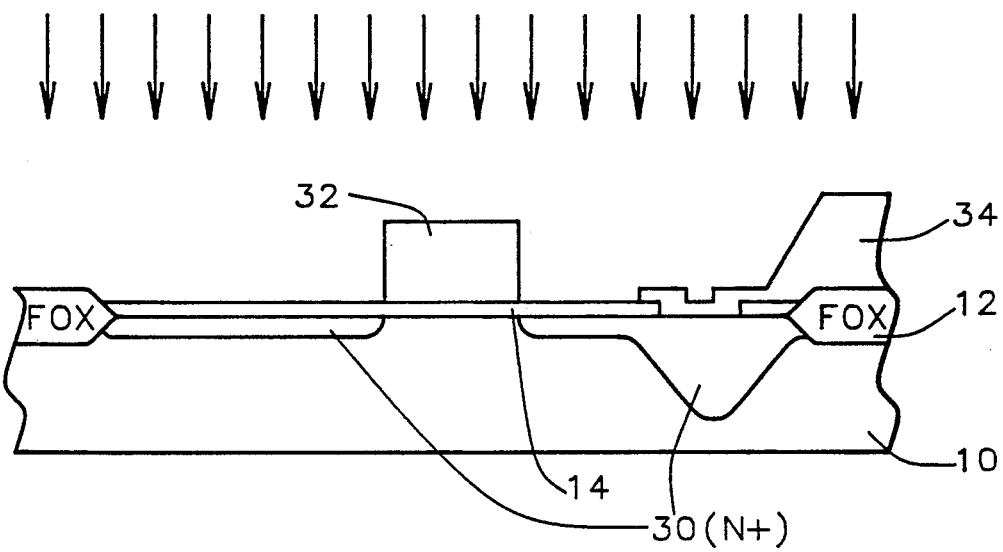

Referring now to FIG. 6, there is shown the source/drain N+ ion implantation and heating step to complete the first embodiment source/drain buried contact structure. This implantation can be phosphorus or arsenic to produce N+ regions, or boron to produce P+ regions. Preferred energies and dosages are as follows: for phosphorus, an energy of 40 to 60 Kev and dosage of 1E15 to 8E15; for arsenic, an energy of 70 to 90 Kev and dosage of 1E15 to 5E15; and for boron, an energy of 10 to 30 Kev and a dosage of 1E15 to 3E15. The implanted ions are diffused into the silicon substrate at high temperature range of between about 850° to 950° C. This is done typically in a nitrogen atmosphere with a small percentage of oxygen for control wafer monitoring. The completed source/drain junction is illustrated by 30 in FIG. 6. The dopants in the remaining first and second polysilicon layers 16 and 24 are redistributed by the heating step through out their thicknesses to produce the gate electrode layer 32 and the buried contact layer 34.

Figure 7:
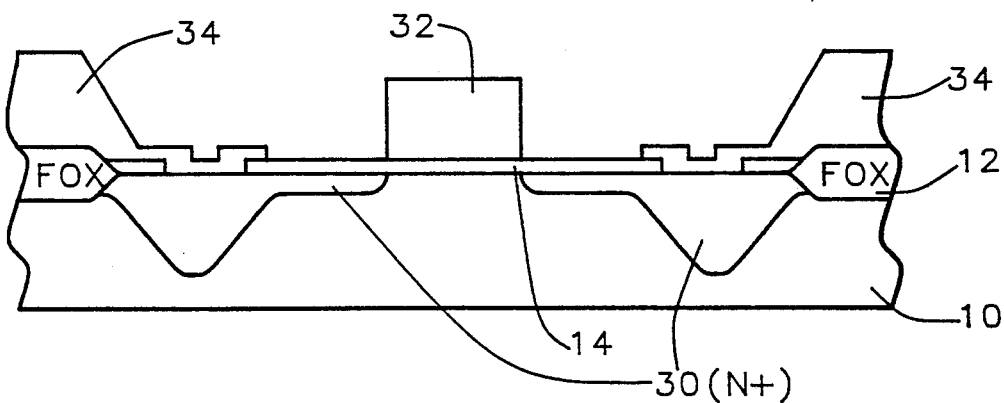
FIG. 7 schematically illustrates a cross-sectional representation of a second embodiment of the invention.

FIG. 7 illustrates a completed buried contact source/drain structure of the second embodiment of the method of the invention. In this embodiment the method has been changed to allow the formation of both source/drain regions with buried contact structures as compared to the embodiment one having only one of two source/drain structures having a buried contact. Like numbers in this FIG. 7 indicate the same structures shown in the earlier first embodiment of FIGS. 1 to 6.

Note that the figures illustrate an N channel MOSFET integrated circuit device. However, it is well understood by those skilled in the art that a P channel FET integrated circuit device could be formed by simply substituting opposite polarities to those given for the N channel embodiment. Also, in a similar way, a CMOS FET could be formed by making both N channel and P channel devices upon the same substrate.

While the invention has been particularly shown and described with reference to the preferred embodiments thereof, it will be understood by those skilled in the art that various changes in form and details may be made without departing from the spirit and scope of the invention.

What is claimed is:

1. The method of forming a buried contact to source/drain regions in a silicon substrate comprising:

forming a silicon oxide layer over said silicon substrate;

forming a first polysilicon layer over said silicon oxide layer;

providing a resist mask having an opening over the planned said buried contact and isotropically etching said first polysilicon layer to form a tapered opening to said underlying silicon oxide which opening undercuts said resist mask;

anisotropically etching said silicon oxide layer using the said resist mask which results in an opening to said silicon substrate corresponding to the planned said buried contact while leaving a silicon oxide border uncovered with said first polysilicon layer;

depositing a second polysilicon layer over said first polysilicon layer, the opening to said silicon substrate and said border of uncovered silicon oxide;

masking the planned said buried contact with a resist mask;

forming openings to the planned said source and drain regions wherein at least one of said source and drain regions is adjacent to said opening of the planned buried contact;

removing said resist mask;

implanting ions through said second polysilicon layer in said opening to said silicon substrate to form said source and drain regions; and heating the structure to cause the formation of a buried region under said buried contact by outdiffusion from the first and second polysilicon layers and to make electrical contact to at least one of said adjacent source and drain regions.

2. The method of claim 1 wherein the thickness of said silicon oxide layer is between about 80 and 250 Angstroms.

3. The method of claim 1 wherein the thickness of said first polysilicon layer is between about 1000 and 4000 Angstroms.

4. The method of claim 1 wherein said etching of said first polysilicon layer is a reactive ion isotropic dry etch using $SF_6/He$.

5. The method of claim 1 wherein the said etching of said silicon oxide layer is a reactive ion anisotropic dry etch using $CF_4/CHF_3$.

6. The method of claim 1 wherein the thickness of said second layer of polysilicon is between about 300 and 1000 Angstroms.

7. The method of claim 1 wherein said outdiffusion formation of said buried region comprises conditions 850° to 950° C. in a nitrogen atmosphere with a small percentage of oxygen for wafer monitoring.

8. The method of forming a buried contact to active device regions in a silicon substrate comprising:

forming a silicon oxide layer over said silicon substrate;

forming a first polysilicon layer over said silicon oxide layer;

providing a resist mask having an opening over the planned said buried contact and isotropically etching said first polysilicon layer to form a tapered opening to said underlying silicon oxide which opening undercuts said resist mask;

anisotropically etching said silicon oxide layer using the said resist mask which results in an opening to said silicon substrate corresponding to the planned said buried contact while leaving a silicon oxide border uncovered with said first polysilicon layer;

depositing a second polysilicon layer over said first polysilicon layer, the opening to said silicon substrate and said border of uncovered silicon oxide;

masking the planned said buried contact with a resist mask;

forming openings to the planned said active device regions wherein at least one of said device regions is adjacent to said opening of the planned buried contact;

removing said resist mask;

implanting ions through said second polysilicon layer in said opening to said silicon substrate to form said active device regions; and heating the structure to cause the formation of a buried region under said buried contact by outdiffusion from the first and second polysilicon layers and to make electrical contact to at least one of said adjacent active device regions.

9. The method of claim 8 wherein the thickness of said silicon oxide layer is between about 80 and 250 Angstroms.

10. The method of claim 8 wherein the thickness of said first polysilicon layer is between about 1000 and 4000 Angstroms.

11. The method of claim 8 wherein said etching of said first polysilicon layer is a reactive ion isotropic dry etch using $SF_6/HE$.

12. The method of claim 8 wherein the said etching of said silicon oxide layer is a reactive ion anisotropic dry etch using $CF_4/CHF_3$.

13. The method of claim 8 wherein the thickness of said second layer of polysilicon is between about 300 and 1000 Angstroms.

14. The method of claim 8 wherein said outdiffusion formation of said buried region comprises conditions 850° to 950° C. in a nitrogen atmosphere with a small percentage of oxygen for wafer monitoring.

* * * * *